United States Patent
Reeder et al.

[11] 3,978,731
[45] Sept. 7, 1976

[54] SURFACE ACOUSTIC WAVE TRANSDUCER

[75] Inventors: Thomas M. Reeder, Glastonbury; Anthony J. Demaria, West Hartford, both of Conn.

[73] Assignee: United Technologies Corporation, Hartford, Conn.

[22] Filed: Feb. 25, 1974

[21] Appl. No.: 445,193

[52] U.S. Cl. .......................... 73/407 PR; 73/DIG. 4
[51] Int. Cl.² .................... G01L 9/00; G01L 11/00
[58] Field of Search ........... 73/67.5 R, 67.6, 517 R, 73/517 AV, 407, DIG. 4; 333/30 R, 72

[56] References Cited
UNITED STATES PATENTS

| | | | |
|---|---|---|---|
| 2,938,386 | 5/1960 | Anderson et al. | 73/67.6 X |
| 3,241,373 | 3/1966 | Ricketts et al. | 73/517 R X |
| 3,513,430 | 5/1970 | Heller | 73/398 AR |
| 3,575,050 | 4/1971 | Lynnworth | 73/194 A |
| 3,580,057 | 5/1971 | Seegmiller | 73/67.6 |
| 3,723,915 | 3/1973 | Adler et al. | 333/30 R |
| 3,812,709 | 5/1974 | Benson et al. | 73/67.5 R |
| 3,848,144 | 11/1974 | Schissler | 73/517 R X |
| 3,863,497 | 2/1975 | vandeVaart et al. | 73/517 R X |

*Primary Examiner*—James J. Gill
*Attorney, Agent, or Firm*—Donald F. Bradley

[57] ABSTRACT

Surface acoustic waves are propagated across a thin, flexible diaphragm which is subjected to an applied external pressure. Since the wave velocity and path length vary with diaphragm deformation, the acoustic wave delay time is a function of the applied external pressure. Electroacoustic transducers are fabricated on opposite edges of the diaphragm for electronic excitation and detection of the surface acoustic wave. An electronic feedback path including the two transducers, the wave path, and an electronic amplifier oscillates at a frequency which is determined by the delay time required for acoustic wave propagation over the diaphragm path, and which decreases approximately linearly with applied external pressure. A second acoustic path called the reference path has a length equal to the first path and in the preferred embodiment contains a diaphragm which is subject to a different applied pressure. A second electronic feedback path composed of two transducers, the reference path and a second amplifier oscillates at a second frequency called the reference frequency. By applying a sample of the first and second oscillator voltages to a semiconductor mixer, a difference frequency output is obtained which is proportional to the differential pressure. The difference frequency output is approximately independent of temperature, and is easily converted to various digital codes by use of standard frequency counter circuits. If only one set of transducers is used, the device can also measure temperature in a digital manner. By adding a mass load to the center of the diaphragm, acceleration may be measured. Stress or strain measurements may also be made by bonding the diaphragms or only the transducers directly on the physical surface to be measured.

2 Claims, 12 Drawing Figures

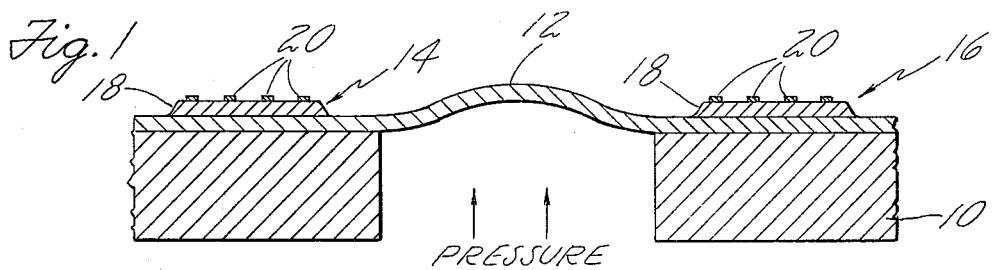
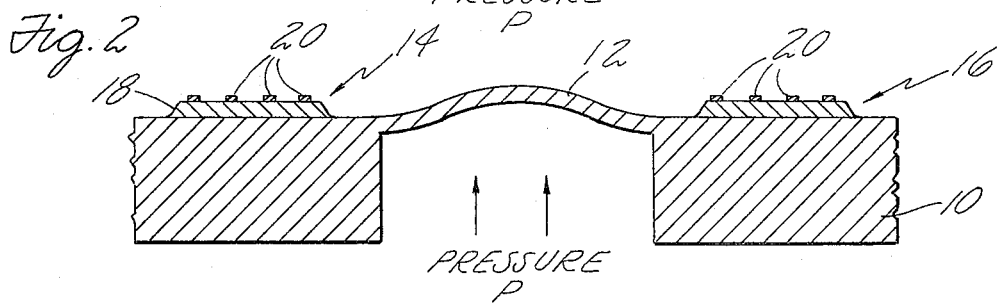
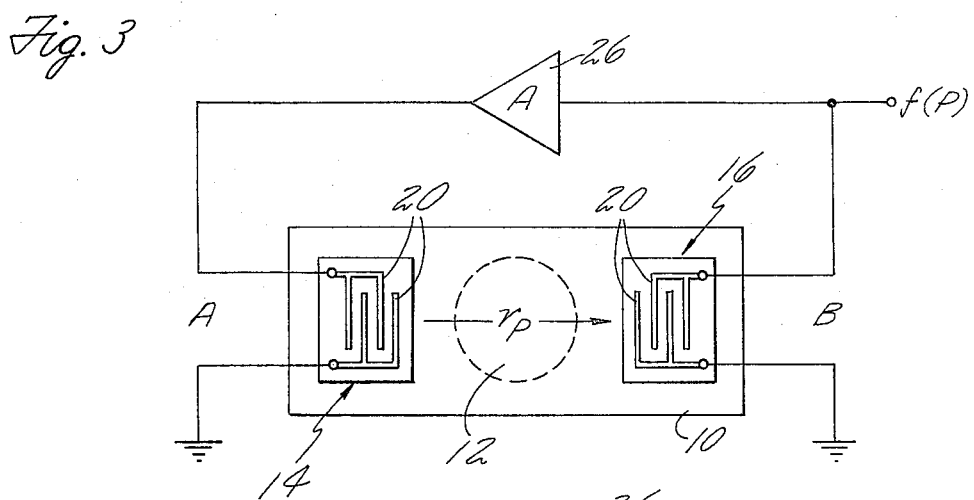
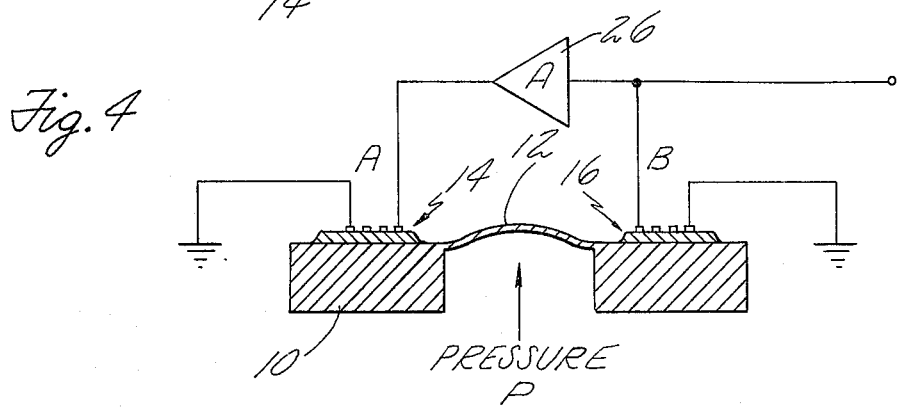

SURFACE ACOUSTIC WAVE TRANSDUCER

BACKGROUND OF THE INVENTION

1. FIELD OF THE INVENTION

This invention relates to a transducer which uses surface acoustic waves as a means of detecting pressure, acceleration, temperature, stress or strain in a digital manner, and particularly to a transducer which utilizes surface acoustic waves to detect the surface path deformation of a flexible diaphragm which is subjected to an external load or force.

2. DESCRIPTION OF THE PRIOR ART

Pressure transducers for converting pressure into electronic signals compatible with testing, indicating and control systems are well known in the art. Many such pressure transducers contain elements such as magnets, coils, switching circuits, mechanical vibratory elements and resonant crystals. to produce digital outputs from the prior art pressure transducers, techniques such as pulse torquing and analog-to-digital conversion are also well known.

As technologies such as turbine engines and their controls are increasing in complexity and are being exposed to increasingly severe environments, it is desirable to have available a simple, inexpensive and rugged pressure transducer compatible with state-of-the-art advances in the technology. The availability fo small, rugged, reliable and relatively inexpensive digital computers has firmly established the use of such computers in advanced turbine engine controls. Prior art pressure transducers have not kept step with the turbine engine and control technology, and suffer from disadvantages such as cost, size, power consumption, reliability and sensitivity to shock, vibration, electromechanical interference and temperature variations. Many prior art transducers have analog outputs which are not directly compatible with advanced digital systems, and require additional electronic conversion devices.

The present invention incorporates recent advances in microelectronic technology and utilizes surface acoustic waves as a means of detecting gas or liquid pressure in a manner compatible with digital systems. The use of surface acoustic waves results in a pressure transducer which is small, rugged, inexpensive to fabricate, sensitive, reliable as a result of its integrated electronics fabrication techniques and having a low power consumption. The transducer may also be used to sense acceleration, temperature, stress or strain.

SUMMARY OF THE INVENTION

The present invention utilizes surface acoustic wave phenomena to generate a frequency which is a function of applied external pressure or force. Since a frequency output is easily converted to various digital codes by use of standard frequency counting circuits, the present invention is compatible with digital systems. The invention makes use of a simple configuration which includes a thin, flexible diaphragm and microelectronic, electroacoustic transducers which are fabricated on opposite edges of the diaphragm. As a result of the applied external pressure or force, the diaphragm is deformed, a condition which causes the diaphragm stress and path length to be changed and, in turn, causes the acoustic wave propagation time between the transducers to be changed. If the transducers and diaphragm surface wave path are connected in a feedback circuit including an amplifier, the circuit can oscillate with a frequency which varies in proportion to diaphragm deformation and hence to the external applied pressure or force. Although in general the circuit could oscillate in a number of modes which are multiples of the fundamental frequency defined by acoustic transit time across the diaphragm, the microelectronic transducers are easily designed to act as filters that permit only one oscillation mode. In typical operation, the changes in oscillation frequency due to pressure or force changes are small compared to the mode frequency.

the invention may also include a second acoustic path, called the reference path, which either does not contain a diaphragm or contains a diaphragm which is subject to a different applied pressure or force. The first and second paths are fabricated to be physically equal in length and located close together so that they are maintained at the same temperature, although their common temperature may vary. A second feedback circuit composed of two transducers, the reference path, and a second amplifier oscillates at a second frequency called the reference frequency. By applying a sample of the first and second oscillator voltages to a semiconductor mixer, a difference frequency output is obtained which is proportional to the differential pressure or force applied to the first and second diaphragms. However, the variations in oscillator frequency caused by temperature will tend to cause equal changes of the same sign in both feedback circuits. As a result, the difference frequency output will tend to be independent of temperature.

The present invention can also perform as a digital output accelerometer with only a small change in the diaphragm configuration. A small lump of material with mass $M_1$ is attached to the bottom diaphragm surface where the acoustic waves do not propagate. If the diaphragm is sealed in an enclosure which eliminates pressure variations, a deformation of the diaphragm will be produced by accelerations of the mass $M_1$ and the external acceleration. If the diaphragm acoustic path and associated transducers are connected in a feedback circuit with an amplifier, the circuit can oscillate with a frequency which varies in proportion to the applied acceleration. As before, a reference diaphragm with different mass $M_2$ may be provided along with an associated second feedback circuit to give a reference oscillation frequency. If the two diaphragms are constructed to attain the same temperature, the difference frequency obtained by applying samples of both feedback circuits to a semiconductor mixer will tend to be independent of temperature.

The transducer may also be used to measure stress or strain by bonding the diaphragm or only the transducers directly to the physical surface to be measured.

BRIEF DESCRIPTION OF THE DRAWINGS

FIG. 1 is a side elevation in schematic form of the pressure transducer in a bonded configuration.

FIG. 2 is a side elevation in schematic form of the pressure transducer in a monolithic configuration.

FIG. 3 is a plan view schematic representation of the pressure transducer and associated feedback circuitry.

FIG. 4 is a side elevation schematic representation of the pressure transducer and associated feedback circuitry.

Figure 5:
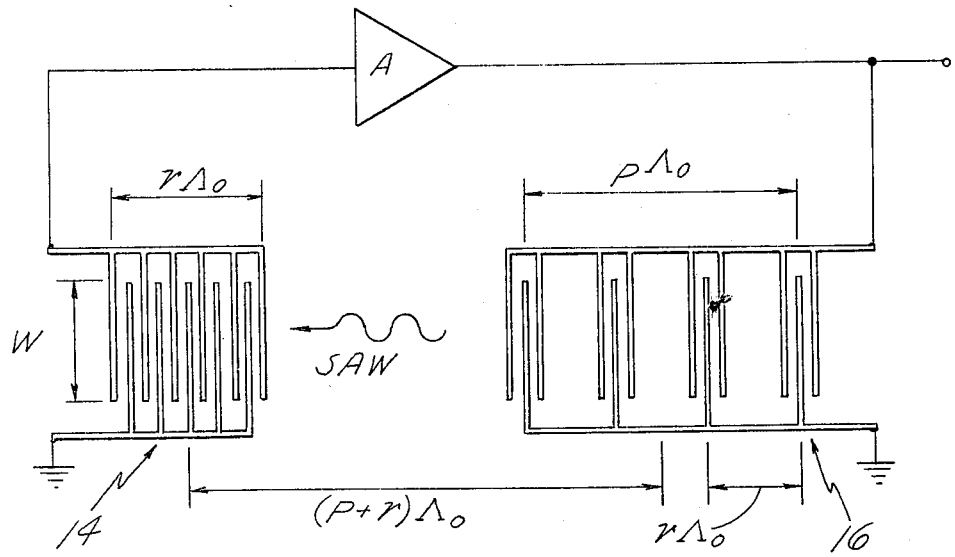
FIG. 5 is a schematic diagram of the pressure transducer showing an improved electrode pattern to suppress selected frequency modes.

DESCRIPTION OF THE PREFERRED EMBODIMENT the basic pressure transducer configuration is illustrated in FIGS. 1 to 4. The transducer consists of a pressure dependent surface acoustic wave delay line and an electronic feedback circuit which provides a circuit oscillation frequency that is determined by the applied pressure.

The pressure dependent surface acoustic wave delay line is composed of a sturdy substrate 10, a thin, flexible diaphragm 12 which may be exposed to a gas pressure, P, and two electroacoustic transducers 14 and 16 which are fabricated on opposite edges of the diaphragm surface. Depending on the desired fabrication and operating environment, the delay line may be constructed in either of the two configurations shown specifically in FIGS. 1 and 2. In FIG. 1, the diaphragm 12, which may be metal, dielectric, semiconductor or a composite of these materials, is either bonded to the substrate 10 surface by the use of glue, solder, weld, thermo-compression, or other joining techniques, or the diaphragm may be grown or deposited on the substrate surface by vacuum evaporation, rf sputtering or chemical vapor deposition. The substrate 10 material, which may also be metal, dielectric, or semiconductor, is chosen to favor the desired fabrication approach. In the case of bonded fabrication, where the diaphragm 12 and substrate 10 may be handled as two separate components, the hole or opening in the substrate 10 that defines the diaphragm lateral dimensions will usually be milled or cut through the substrate 10 before the two components are bonded. If the diaphragm 12 is grown or deposited on the substrate 10 surface, the hole in the substrate is defined by milling, spark erosion, or chemical etch techniques as are frequently utilized in microelectronic circuit fabrication.

the monolithic delay line configuration, which is illustrated in FIG. 2, utilizes a diaphragm 12 which is fabricated in a monolithic substrate 10. The hole or opening which defines the diaphragm lateral dimensions is constructed by milling, spark erosion, or chemical etch techniques as noted above. However, here the diaphragm thickness may be controlled by milling the opening only part way through the substrate 10 and then grinding or polishing the top surface until the desired diaphragm thickness is reached.

the electroacoustic transducers show generally at 14 and 16 are fabricated on the diaphragm-substrate surface by use of standard microelectronic techniques. If the diaphragm 12 is a metal, semiconductor, or nonpiezoelectric dielectric, a thin-film strip of piezoelectric material 18 such as ZnO will be fabricated at the desired transducer sites, preferably by rf sputtering. A thin-film of Cr/Au or other metal is often deposited before the ZnO to improve the transducer piezoelectric properties. The key component in these electroacoustic transducers is a pattern of thin film electrodes 20 which is fabricated by vacuum deposition and microelectronic pattern generation on top of the piezoelectric thin film 18. This metal pattern, which will usually be Al, has electrodes 20 arranged in either an interdigital or a grating pattern. In the interdigital case shown in detail in FIG. 3, the width d and spacing of the electrodes 20 is designed to be one quarter of the desired acoustic wavelength $\Lambda_o$ (i.e., $d = \Lambda_o/4$). Alternate electrodes are connected together in the interdigital case as seen best in FIG. 3. On the other hand, the grating pattern (not shown) is designed so that the electrode width and spacing is one half of the desired acoustic wavelength ($d = \Lambda_o/2$). With the grating pattern all the electrodes are connected in parallel and it is important to have a metal conducting film, diaphragm or substrate under the piezoelectric film. the transducer is finished by using microelectronic bonding wires to join the transducer pattern to the rest of the pressure transducer circuit.

An alternative electroacoustic transducer configuration may be employed if the diaphragm material is usefully piezoelectric. The transducer electrode pattern (interdigital or grating type) may then be fabricated directly on the diaphragm surface, without the need for an intervening piezoelectric thin film. The efficient design of all surface acoustic wave transducers considered above is described in the review article by R. M. White, "Surface Elastic Waves", Proc. IEEE, 58, 1238–1276 (August 1970).

In general, the use of the thin-film piezoelectric strip 18 of FIG. 1 is to be preferred because the diaphragm 12 can then be chosen to optimize its mechanical properties without the heavy restraint of also possessing useful piezoelectric coupling. Rf sputtered ZnO is an attractive piezoelectric thin-film material for many pressure transducer applications because it adheres well to a variety of diaphragm surfaces and because it has relatively high piezoelectric coupling. For example, high efficiency ZnO electroacoustic transducers can be fabricated on silicon diaphragms, even if the silicon is highly conducting, if a thin-film of Cr/Au is first applied to the silicon surface. The silicon can be previously thinned by standard microcircuit techniques to thicknesses on the order of 0.002 inch. After transducer fabrication, the silicon can be bonded to a sturdy metal substrate as discussed earlier.

High efficiency ZnO transducers 14 and 16 can also be fabricated for the monolithic delay line configuration of FIG. 2 where the diaphragm 12 is first etched or milled out of a monolithic silicon, metal, or dielectric substrate 10. Again, a layer of Cr/Au would normally be applied to the substrate surface to enhance the ZnO fabrication and efficiency.

For the high temperature applications in the range above 500°C, te use of rf sputtered thin-films of ALN deposited on sapphire diaphragms can be expected to be important. The ALN/sapphire configuration has relatively strong piezoelectric coupling and does not decompose at temperatures at least up to 1000°C.

FIG.3 and 4 show the schematic circuit diagram used in the present invention to provide a circuit oscillation frequency that is determined by the applied external pressure, P. If an alternating voltage from a source (not shown) is applied to terminal pair A, a spatially varying electric field will be generated in the left-hand electroacoustic transducer 14 and surface acoustic waves will be emitted by piezoelectric interaction in the two directions normal to the transducer electrodes 20. Usually it is desired to only use the waves that propagate to the right toward the flexible diaphragm 12; the waves emitted in the opposite direction may be absorbed by roughening the surface in that direction. Transducers with interdigital or grating electrode patterns are most efficient at frequencies near the synchronism frequency $f_o$ which is defined by $$f_o = v_a/\Lambda_o$$

where $v_a$ is the surface acoustic wave velocity of the transducer-diaphragm configuration and $\Lambda_o$ is the periodic electrode dimension. In general, these transducers act like filters with preferred passbands near the frequency $f_o$. It will be described subsequently how the transducer passbands can be designed to optimize the operation of the pressure transducer. The acoustic wavelength corresponding to $f_o$ is $\Lambda_o = v_a/f_o$. Since acoustic wave velocities are relatively small, approximately 3000 m/sec, surface acoustic wavelengths are very short, approximately 30 micrometers for 100 MHz operation. As the penetration depth of a surface wave is limited to approximately one wavelength, the diaphragm thickness can be very thin and yet support a surface wave without mode conversion and its attendant distortion. Consequently, diaphragms for the surface wave pressure transducer can be made very thin to extend the sensitivity of the device to small pressure ranges.

Surface waves emitted by the left-hand electroacoustic transducer 14 in FIGS. 3 and 4 will travel across the diaphragm 12 in a beam or channel to reach the right-hand transducer 16 where piezoelectric interaction will yield an alternating voltage across terminal pair B. If no gas pressure or other stresses are exerted on the diaphragms 12, a short pulse of rf energy with frequency near $f_o$ applied to terminal pair A will reach terminal pair B with a delay time of $$\tau_{po} = l_{po}/v_{ao}$$

where $l_{po}$ and $v_{ao}$ are respectively the center-to-center path length between electroacoustic transducers 14 and 16, and the mean surface acoustic wave velocity at zero diaphragm stress. It will be convenient to divide the delay time $\tau_{po}$ into two components $$\tau_{po} = \tau_{eo} + \tau_{do}$$

where $\tau_{eo}$ and $\tau_{do}$ are respectively the delay time for waves passing over the rigid substrate and flexible diaphragm portions of the delay path. If the diaphragm is flexed due to external applied pressure P, the delay time $\tau_{eo}$ will remain constant, but the diaphragm delay will be approximately given by $$\tau_d = \tau_{do} \left[ \frac{1 + \alpha_1 P + \alpha_2 P^2 + \ldots}{1 + \beta_1 P + \beta_2 P^2 + \ldots} \right]$$

where the coefficients $\alpha_1$ and $\beta_1$ are obtained by expressing the delay path and velocity variations in power series expansions with variable P. For small diaphragm flexures, the coefficients may be calculated for a given diaphragm material and configuration using the well-known bending plate theory. A good reference is the book by Timoshenko and Woinowsky - Krieger, *Theory of Plates and Shells*, 2nd Edition, McGraw Hill, 1959. In general, the terms $\alpha_2 P^2$ and $\beta_1 P$ will be the largest while being themselves much smaller than 1 for small P. With a careful choice of diaphragm parameters and configuration, it is possible to achieve the condition where the term $\beta_1 P$ is much larger than $\alpha_2 P^2$, thus giving an almost linear variation of delay time with pressure.

With reference to FIGS. 3 and 4, if delay line terminal pairs A and B are connected in a feedback arrangement with an amplifier 26 and the amplifier gain is increased to the point where the feedback loop gain exceeds unity, the circuit will oscillate in one or more frequency modes defined by $f_n$, $$F_n \tau_{po} + \phi_E/2\pi = n$$

where $\phi_E$ is the phase delay of the amplifier and $n$ is an integer. Since $f_n \tau_{po}$ is usually much greater than $\phi_E/2\pi$ for a delay line feedback circuit, the frequency of the $n$ mode will vary as $\tau_n/\tau_{po}$. If the term $\beta_1 P$ dominates as described above, the frequency of the nth mode will vary approximately as $$f_n = (n/\tau_{po})(1 + \beta_1 P).$$

This equation states that the frequency of the nth mode will vary linearly with applied external pressure. In experiments with a silicon diaphragm pressure transducer with 6.5 mm. diameter and 0.05 mm. thick diaphragm dimensions, $n = 332$, $f_o = 166$ MHz and $\tau_{po} = 2.0$ μs. The coefficient $\beta_1$ was found experimentally to be approximately $-10^{-4}/$ atmosphere over the zero to one atmosphere pressure range. The frequency output of the pressure transducer, therefore, decreased by approximately 16.6 KHz over a one atmosphere pressure change. Since frequency can be counted to 1 Hz at center frequencies up to 500 MHz by standard electronic units such as the Hewlett-Packard Model 5327C, the present invention has the potential for measurement accuracies on the order of 0.01 percent.

The fact that many frequency modes may be allowed in the circuit of FIGS. 3 and 4 could be a serious problem because instabilities could cause the circuit to jump from mode to mode, thus giving a false indication of pressure change. A straight forward technique that avoids mode instabilities makes use of a special many electrode transducer design and is shown in FIG. 5. The two transducers 14 and 16 are designed with the same number of electrodes but are spatially distributed quite differently. The lefthand transducer 14 has r pairs of electrodes and, therefore, has a total length in th acoustic propagation direction of $r\Lambda_o$. The right-hand transducer has $p/r$ groups of electrodes where all groups are in parallel, each group has s pairs of electrodes and the center-to-center spacing of these groups is $r\Lambda_o$. Finally, the center-to-center spacing of the two electroacoustic transducers 14 and 16 is designed to be $(p + r)\Lambda_o$. the overall frequency response obtained when passing through the two transducers 14 and 16 is found to vary approximately as $(\sin X/X)^2$ where $X = 2\pi q (f-f_o)/f_o$ and $q = p + r$. This transducer arrangement provides nulls in the feedback loop response at the frequencies $f_m$, $$f_m = f_o [1 + m/q]$$

where $m$ is any integer different from zero. If the transducer center-to-center spacing is made exactly $q\Lambda_o = q(v_a/f_o)$, then $f_o/q = 1/\tau_{po}$ and the transducer response strongly attenuates all frequency modes $f_n$ described earlier except for the center mode $f_o = v_a/\Lambda_o$. The above transducer design was first used in England to stabilize nonpressure dependent surface acoustic wave feedback oscillators (Ref: Crabb, Lewis, and Maines, "Surface Acoustic Wave Oscillators: Mode Selection and Frequency Modulation", Elctronics Lett., 9, 195-197, 17 May 1973). Transducers with a many electrode, narrow-band characteristic were used in the silicon diaphragm pressure transducer descrbed earlier. No mode instabilities were observed in that device.

Figure 6A:
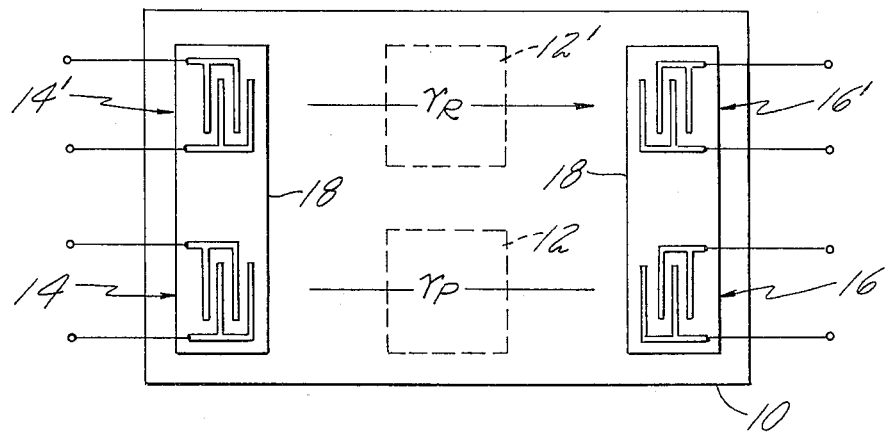
FIG. 6A is a plan view of a dual channel pressure transducer configuration.
Figure 6B:
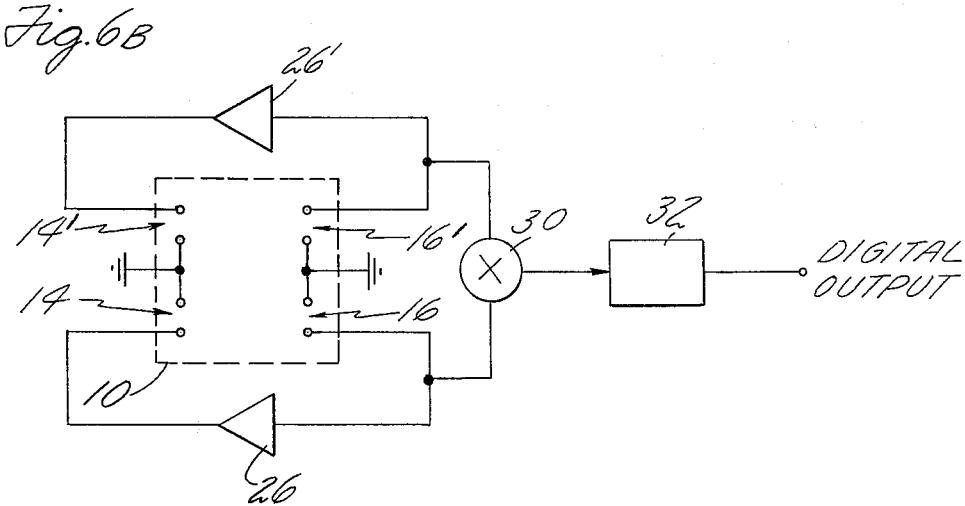
FIG. 6B is a schematic representation of the transducer of FIG. 6A.

An important problem in many devices that utilize acoustic wave phenomena is the change in acoustic parameters and the change in acoustic delay experienced versus temperature. A linear temperature coefficient on the order of 30 ppm/°C is observed for most delay line and diaphragm materials. Since the observed sensitivities for the present invention are on the order of 100 ppm/atm, a severe problem with temperature drift could be expected. FIGS. 6A and 6B illustrate a unique dual acoustic channel configuration which can significantly cancel temperature effects and gives a pressure dependent frequency output which is low enough to be counted with inexpensive counters like the Fluke Model 1941A. The two acoustic channels are fabricated close together on the same substrate 10 so that their temperature difference will be very small. The primary channel consists of transducer assemblies 14 and 16 fabricated on a piezoelectric thin film 18 and separated by a primary diaphragm 12 as previously described. The reference channel consists of transducer assemblies 14' and 16' fabricated on the same piezoelectric thin film 18 and separated by a reference diaphragm 12'. Ideally the diaphragms 12 and 12' will be identical to insure equivalent thermal radiation characteristics. However, provision is made to apply different external pressures to the two channels. With zero applied pressure at both channels, the surface wave delay will be the same for both channels, and if identical amplifiers and feedback connections are used, the zero pressure oscillation frequencies $f_p$ and $f_R$ for the primary and reference channels respectively would be identical. In practice, a small but constant difference frequency will be observed due to circuit variances. This difference will be neglected here. Assuming that the feedback circuits for the primary and reference channels including amplifiers 26 and 26' are connected to a mixer 30 as shown in FIG. 6B, and that the difference frequency output $f_D = F_P - f_R$ is selected, since the two channels are nearly identical it may be assumed that their zero pressure frequencies are nearly identical $(f_{Po} \simeq f_{Ro})$ and their linear pressure sensitivities are nearly the same $(\beta_1 P \simeq \beta_1 R)$. The difference frequency output is then $$F_D \simeq f_{Ro} \beta_1 R (P_P - P_R)$$

which illustrates that the large temperature dependent acoustic variation can be cancelled out by use of the dual channel configuration and difference frequency output. The dual channel device works as a differential pressure transducer; the output is proportional to $(P_P - P_R)$. If the reference channel pressure is held constant, the output then becomes a gauge of the absolute pressure $P_P$. The difference frequency output from mixer 30 is then coverted to a digital output by a frequency counter 32 (FIG. 6B).

Figure 7A:
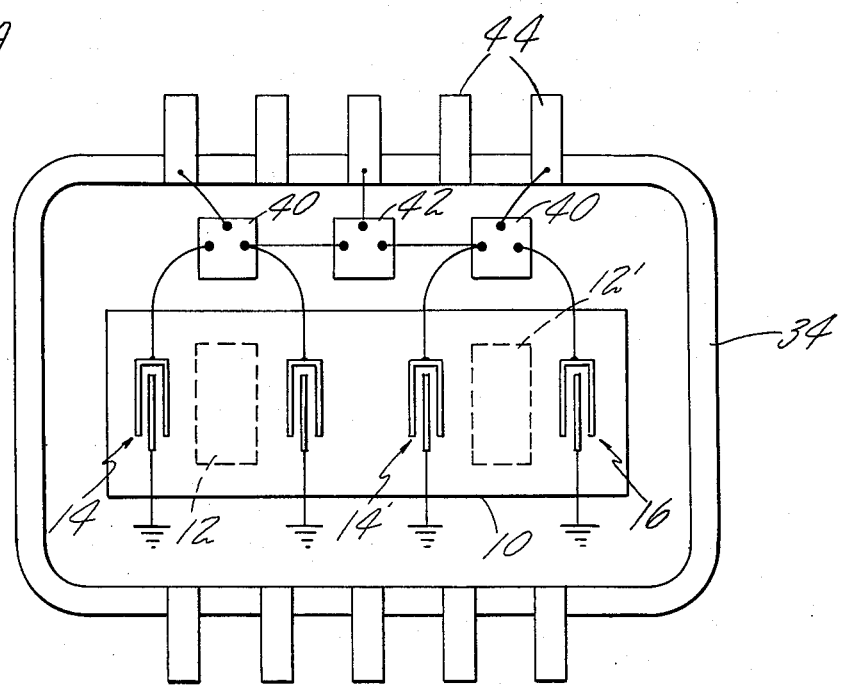
FIG. 7A is a plan view of an encapsulated pressure transducer.
Figure 7B:
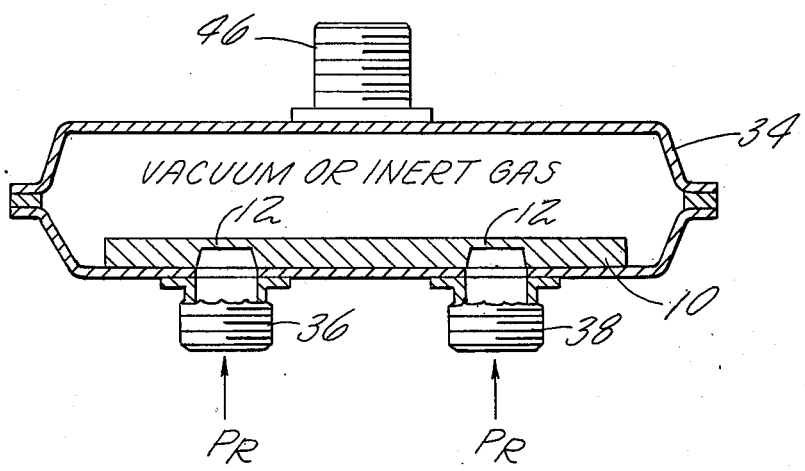
FIG. 7B is a side elevation of the encapsulated pressure transducer of FIG. 7A.

In the foregoing it has been tacitly assumed that the acoustic propagation surface of the transducer was held in a vacuum environment so that all diaphragm pressure could be exerted on the bottom side of the diaphragm. This assumption is important because the surface wave can be perturbed and attenuated if the propagation environment is changing or is viscous due to moisture or other liquid effects. Because of these environmental effects, care must be utilized in packaging the present invention if reliable operation is to be achieved. FIGS. 7A and 7B show one way in which the device can be conveniently mounted so as to discourage environmental effects. The dual channel substrate 10 on which is mounted the transducer 14, 14', 16 and 16' is affixed to the bottom of a microelectronic flatpak package 34 so that the surface wave propagation surface is facing up and the pressure dependent diaphragms 12 and 12' are facing into separate gas presure ports 36 and 38. The flat-pak package 34 may be conveniently large enough to accommodate the feedback loop amplifiers 40 and the output circuit mixer 42 appropriately connected to the transducers. After mounting these components and making microelectronic terminal connections 44, the flat-pak top cover can be welded on in either a vacuum or in a light inert gas environment. The flat-pak cover can have a mounting stud 46 for convenient mounting of the transducer in a variety of applications.

Figure 8:
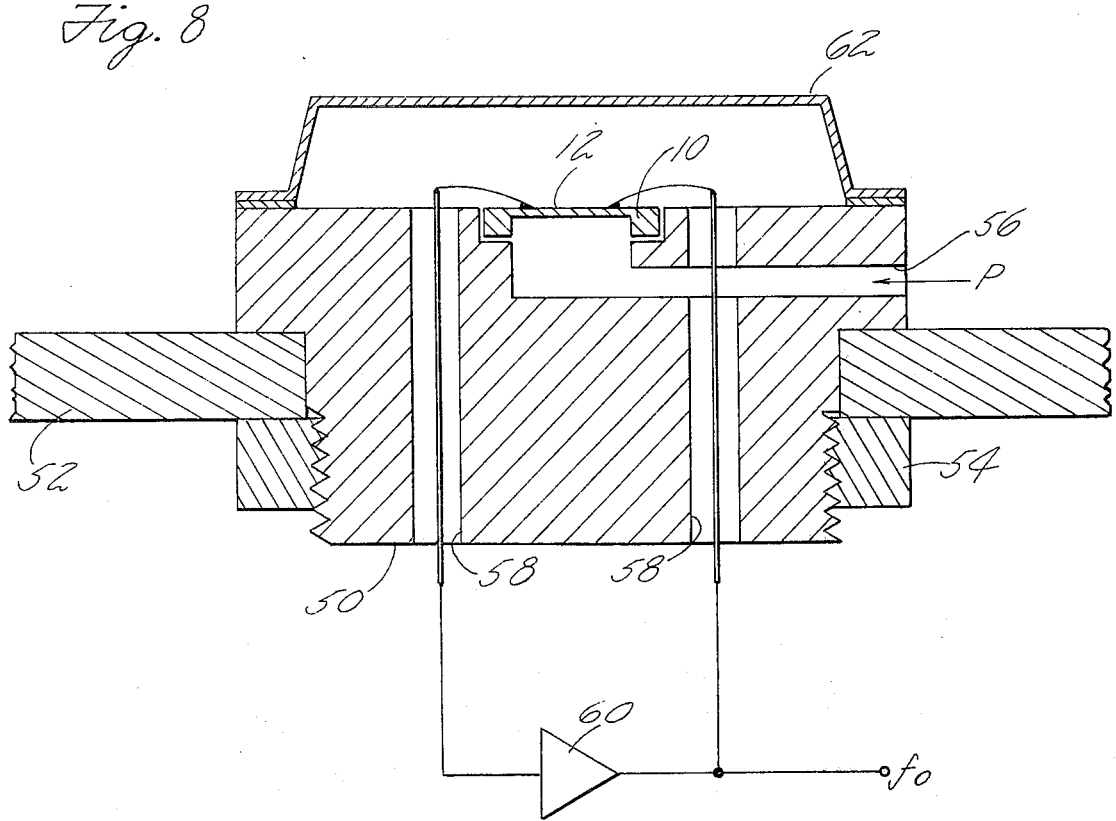
FIG. 8 is a side elevation of a high temperature pressure transducer configuration.

Since the pressure transducer delay line configuration uses only stable, passive materials, it has the potential for operation at very high temperatures, perhaps as high as 1000°C. Such temperatures would be too high to allow reliable operation of the electronic feedback amplifiers which are usually limited to 100°C or lower. FIG. 8 illustrates a feedthrough configuration which would allow the dual channel pressure transducer to operate in a high temperature environment while the feedback circuit could be operated some distance away under relative low temperature conditions. Referring to the FIGURE, the substrate 10 on which the appropriate delay line including the acoustic transducers is fabricated and which contains a diaphragm 12 is mounted within a plug assembly 50, the plug being threaded on its outside surface so that it may be mounted in a bounding wall 52 and secured by a locking nut 54. A passageway 56 connects the diaphragm 12 with the pressure P to be measured. The electrical connections to the transducers are passed through channels 58 to the opposite side of wall 52 where connections with amplifier 60 and the other electronics are made. Seals may be provided for the electrical connections where necessary. A cover plate 62 secured to plug 50 protects the delay line for the environment, the space adjacent the substrate being evacuated or filled with inert gas. In this manner the diaphragm may be opened through port 56 to a high temperature environment such as a turbine engine where it is desired to measure a pressure, while the amplifier 60 and other heat sensitive electronics may be at a much lower temperature. High temperature coax cable could be used to connect the delay line and feedback amplifiers; even several feet of cable could be used as the delay time for the cable is only nanoseconds per foot while the delay line delay will be one microsecond or more.

Figure 9:
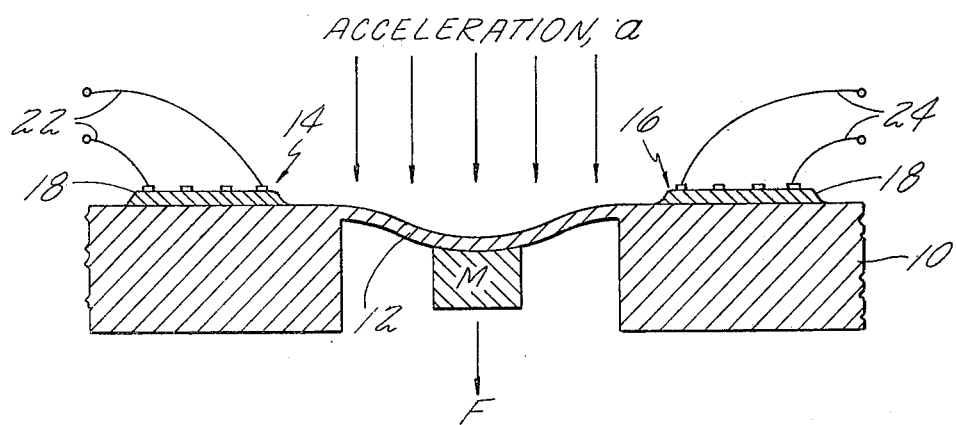
FIG. 9 is a side elevation of a transducer modified for acceleration measurement.

The basic configuration for the surface acoustic wave pressure transducer can be utilized for measuring other quantities in addition to pressure. Acoustic propagation is usually very sensitive to temperature variations. In the dual channel configuration, the feedback circuit frequency in either channel will be approximately linearly varying in frequency if the pressure is held constant. In a quite different application, the slightly modified configuration shown in FIG. 9 could be used to measure acceleration. The diaphragm configuration of FIGS. 1 and 2 now has a mass load M attached to the center of the diaphragm 12 so that a force $F = Ma$, where a is the acceleration, will be exerted on the diaphragm. Although the entire diaphragm-substrate would now be sealed in a vacuum or light inert gas environment to eliminate diaphragm pressure due to external gas loading, the basic delay line and feedback oscillator circuit are not changed. Since the oscillator frequency is approximately linearly related to the net force on the diaphragm, the frequency output of the device will now vary in proportion to the applied acceleration A dual channel configuration with different mass loads $M_1$ and $M_2$ in the two channels could be used to cancel out temperature variations.

Figure 10:
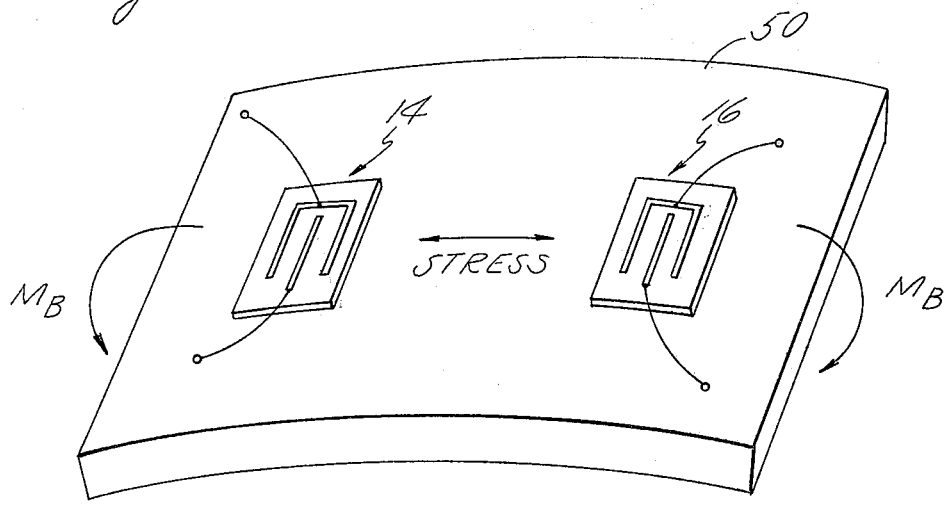
FIG. 10 is a schematic view of a transducer used for stress-strain measurement.

The basic configuration can also be utilized for in situ mechanical stress-strain measurements. In this case, the transducer configuration of FIGS. 1 and 2 is either fabricated directly on the physical surface to be measured, as is illustrated in FIG. 10, or the thin diaphragm with associated transducers is uniformly bonded to the measurement surface. In FIG. 10 transducers 14 and 16 are fabricated directly on the surface of plate 50 which is under stress due to bending moment $M_B$.

The phase delay between transducers will be a function of surface stress, as was observed earlier in the description of pressure transducer operation. As before, the transducer configuration is connected to a feedback amplifier circuit to provide a stress dependent frequency readout. Moreover, for applications on most engineering material surfaces, the relationship between stress and strain is well known. Thus, the basic configuration can provide an accurate measure of surface strain. The principle advantages of the stress-strain sensor illustrated in FIG. 10 over other approaches are: (1) direct fabrication or bonding to the measurement surface to provide a stable measurement configuration; (2) potential for very high temperature operation as, for example, in the critical afterburner region of a jet engine; and (3) compatibility with digital systems.

By keeping the diaphragm or wave propagation surface isolated from changes in applied pressure and strain, the device of this invention can be used to sense temperature. The feedback circuit frequency in this arrangement will then vary approximately linearly as a function of temperature due to the expansion in the diaphragm or wave propagation surface with temperature changes.

The device can also be used as a mass flow meter for measuring the flow of either gases or liquids. This result is accomplished by directing the flow toward the diaphragm in such a way that the flow is reversed after passing over the diaphragm or at the point of contact with the diaphragm. The change in momentum results in a force on the diaphragm that is proportional to the momentum which is in turn equal to the mass per unit length of the flow multiplied by the velocity of the flow. Thus the velocity is measured if the mass density of the flow is known.

While the preferred modes of the invention has been illustrated and described, it will be apparent to those skilled in the art that changes may be made in the form of the apparatus disclosed without departing from the scope of the invention as set forth in the appended claims.

We claim:

1. A pressure transducer comprising a dielectric substrate having a pair of thin, flexible diaphragms formed as a portion thereof, said diaphragms being adapted to deform in response to an applied pressure on one side thereof, first and second pairs of electroacoustic transducers, each transducer comprising a plurality of electrodes disposed on a thin layer of piezoelectric material mounted on said substrate a short distance from said diaphragm such that each pair is mounted on opposite sides of a related one of said diaphragms, means for actuating first electroacoustic transducers of each pair to generate a pair of series of surface acoustic waves, at least a portion of which propagate across the portion of said substrate including the related one of said diaphragms and intersect a second electroacoustic transducer of the related pair producing a corresponding alternating voltage therein, and a pair of electronic feedback circuits, one for each pair of transducers, each including an amplifier connecting the second electroacoustic transducer of the related pair with said first acoustic transducer thereof, each of said feedback circuits having a gain greater than unity and producing a feedback oscillation signal at a frequency which is a function of the velocity changes in said surface acoustic waves produced by deformation of the related one of said diaphragms in response to said applied pressure.

2. A pressure transducer as in claim 1 and further including means for combining said first and second feedback oscillation signals and producing an output signal indicative of the difference therebetween.

* * * * *

UNITED STATES PATENT OFFICE
CERTIFICATE OF CORRECTION

PATENT NO. : 3,978,731

DATED : September 7, 1976

INVENTOR(S) : Thomas M. Reeder and Anthony J. DeMaria

It is certified that error appears in the above-identified patent and that said Letters Patent are hereby corrected as shown below:

In the Abstract, line 33, "diaphragms" should be --diaphragm--

Column 1, line 19, "to" should be --To--

Column 1, line 28, "fo" should be --of--

Column 2, line 12, "the" should be --The--

Column 3, line 18, "the" should be --The--

Column 3, line 52, "the" should be --The--

Column 3, line 62, "the" should be --The--

Column 3, line 62, "show" should be --shown--

Column 4, line 59, "te" should be --the--

Column 4, line 59, "ALN" should be --AlN--

Column 4, line 61, "ALN" should be --AlN--

Column 4, line 64, "Fig." should be --Figs.--

Column 5, line 40, "phragms" should be --phragm--

Column 6, line 23, "nmode" should be --nth mode--

UNITED STATES PATENT OFFICE
CERTIFICATE OF CORRECTION

PATENT NO. : 3,978,731
DATED : September 7, 1976
INVENTOR(S) : Thomas M. Reeder and Anthony J. DeMaria It is certified that error appears in the above-identified patent and that said Letters Patent are hereby corrected as shown below:

Column 6, line 27, "$(1 + {_1}P)$" should be --$(1 + \beta_1 P)$--

Column 6, line 54, "th" should be --the--

Column 6, line 60, "the" should be --The--

Column 7, line 11, "Elctronics" should be --Electronics--

Column 7, line 53, "$F_P$" should be --$f_P$--

Column 7, line 60, "$F_D$" should be --$f_D$--

Column 8, line 21, "presure" should be --pressure--

Signed and Sealed this

Second Day of November 1976

[SEAL]

Attest:

RUTH C. MASON
*Attesting Officer*

C. MARSHALL DANN
*Commissioner of Patents and Trademarks*